(12) United States Patent
Lempkowski et al.

(10) Patent No.: US 7,508,352 B2
(45) Date of Patent: Mar. 24, 2009

(54) EMBEDDED ASSEMBLY INCLUDING MOVEABLE ELEMENT AND ANTENNA ELEMENT

(75) Inventors: Robert Lempkowski, Elk Grove Village, IL (US); Manes Eliacin, Buffalo Grove, IL (US); Keryn Lian, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 523 days.

(21) Appl. No.: 11/275,589

(22) Filed: Jan. 18, 2006

(65) Prior Publication Data

US 2007/0164905 A1 Jul. 19, 2007

(51) Int. Cl.
*H01Q 1/38* (2006.01)
*H01P 11/00* (2006.01)

(52) U.S. Cl. .............................. 343/873; 343/700 MS; 29/600

(58) Field of Classification Search .......... 343/700 MS, 343/873; 29/600
See application file for complete search history.

(56) References Cited

U.S. PATENT DOCUMENTS 6,069,587 A * 5/2000 Lynch et al. .......... 343/700 MS
6,501,427 B1 * 12/2002 Lilly et al. ............. 343/700 MS

* cited by examiner

*Primary Examiner*—Michael C Wimer

(57) ABSTRACT

An embedded assembly (200) and method for fabricating the same is provided. The embedded assembly includes an organic substrate (102) and at least one movable element (104). The embedded assembly also includes at least one antenna element (106). The method includes providing (502) the organic substrate, and embedding (504) the at least one moveable element on the organic substrate. The method also includes embedding (506) the at least one antenna element on the organic substrate.

6 Claims, 9 Drawing Sheets

EMBEDDED ASSEMBLY INCLUDING MOVEABLE ELEMENT AND ANTENNA ELEMENT

FIELD OF THE INVENTION

This invention relates in general to the field of embedded assemblies, and more specifically, to the fabrication of embedded assemblies that include moveable elements and antenna elements.

BACKGROUND OF THE INVENTION

Printed wiring boards (PWB), also referred to as printed circuit boards (PCB), are extensively used as a platform for mounting a variety of electrical components in electronic devices. These electrical components include passive devices like resistors, capacitors, inductors, switches, diodes, filters, and other radio-frequency (RF) components. Typically, passive devices represent a significant portion of the total number of electrical components present in a PWB circuit.

In addition to the electrical components, tunable components with movable parts, such as switches, can also be provided in the PWBs. Smaller and complex electronic devices require smaller switches. Current small solid-state switches are not ideal because they exhibit a finite leakage that prevents a complete switch-off. Further, available mechanical and electro-mechanical switches are bulky and consume a large amount of power. Micro electro-mechanical systems (MEMS) address these drawbacks. However, these MEMS devices are fabricated from crystalline silicon or silicon dioxide, which require fabrication methods that are not compatible with PWB fabrication. Therefore, MEMS devices made by this technology must be made separately, and then incorporated into PWBs.

There are a number of methods for embedding the electrical components and MEMS devices in the PWBs. One of these methods involves forming an interconnect section and a variable passive section on a substrate. The variable passive section may be formed from metal interconnect layers separated by a dielectric. The variable section comprises at least a movable element.

However, in existing methods, antennas are treated as a separate assembly and connected to RF front-ends. Individual silicon MEMS devices are used for tuning antennas and RF front-ends. These silicon MEMS devices are not compatible with the PWB fabrication process. Further, existing methods may not facilitate embedding a combination of MEMS devices and antennas on an organic substrate.

BRIEF DESCRIPTION OF THE FIGURES

The present invention is illustrated by way of example, and not limitation, in the accompanying figures, in which like references indicate similar elements, and in which.

Figure 1:
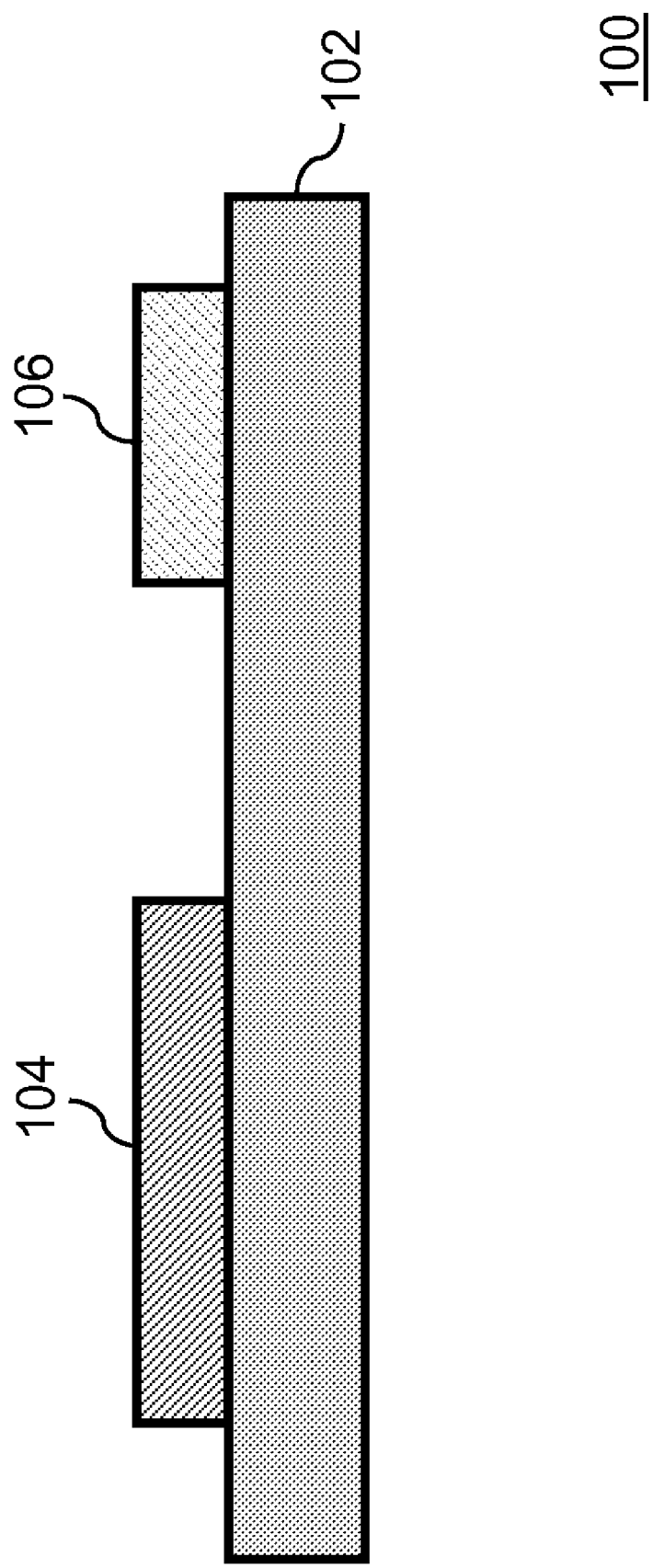
FIG. 1 is a block diagram illustrating an assembly of electrical components in an electronic device, in accordance with an embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail the embedded assembly in accordance with the present invention, it should be observed that the present invention resides primarily in combinations of method steps and system components related to an embedded assembly. Accordingly, the systems components and method steps have been represented where appropriate by conventional symbols in the drawings, showing only those specific details that are pertinent to understanding the present invention so as not to obscure the disclosure with details that will be readily apparent to those of ordinary skill in the art having the benefit of the description herein.

In this document, relational terms may be used solely to distinguish one entity or action from another entity or action without necessarily requiring or implying any actual such relationship or order between such entities or actions. The terms 'comprises,' 'comprising,' or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by 'comprises . . . a' does not, without more constraints, preclude the existence of additional identical elements in the process, method, article, or apparatus that comprises the element. The term 'another', as used herein, is defined as at least a second or more. The terms 'including' and/or 'having', as used herein, are defined as comprising.

Various embodiments of the present invention describe an embedded assembly. The embedded assembly includes an organic substrate, and at least one movable element embedded on the organic substrate. The embedded assembly also includes at least one antenna element embedded on the organic substrate.

Various embodiments of the present invention further provide a method for fabricating an embedded assembly. The method includes providing an organic substrate, and embedding a movable element on the organic substrate. The method also includes embedding an antenna element on the organic substrate. The antenna element can be an individual patterned structure or an array of multiple antenna structures.

FIG. 1 is a block diagram illustrating an assembly 100 of electrical components in an electronic device, in accordance with an embodiment of the present invention. The assembly 100 includes an organic substrate 102, a movable element 104, and an antenna element 106. Examples of organic substrate 102 include, but are not limited to reinforced resin materials such as FRY, polymide, liquid crystal polymers, adhesive films, and the like.

The movable element 104 can be embedded on the organic substrate 102. Examples of the movable element 104 include a Micro Electro Mechanical Systems (MEMS) switch, an organic MEMS switch, and the like. The antenna element 106 can also be embedded on the organic substrate 102. Examples of the antenna element 106 include, but are not limited to, patches, arrays, laminated versions of Planar Inverted F-type Antennas (PIFA), and Planar Inverted Cone Antennas (PICA). The movable element 104 and the antenna element 106 can be operatively coupled to each other. The movable element 104 is capable of tuning the antenna element 106. Though the assembly 100 is shown to include only the movable element 104 and the antenna element 106, the assembly 100 can include, in addition to other components, a plurality of movable elements and a plurality of antenna elements.

Figure 2:
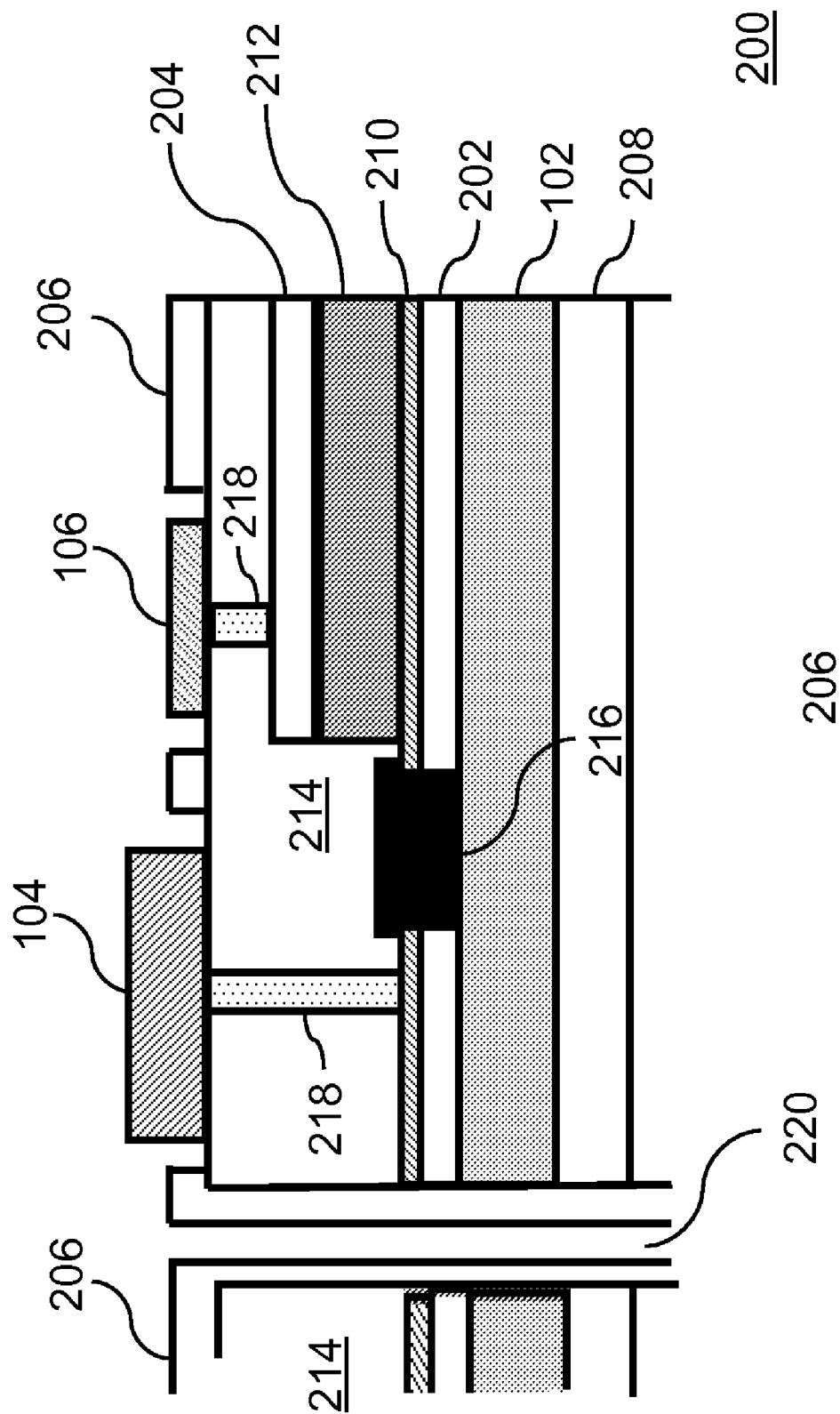
FIG. 2 is a block diagram illustrating cross-sectional view of components of an embedded assembly, in accordance with an embodiment of the present invention.

FIG. 2 is a block diagram illustrating a cross-sectional view of components of an embedded assembly 200, in accordance with an embodiment of the present invention. The embedded assembly 200 includes, in addition to the organic substrate 102, the movable element 104, the antenna element 106; a plurality of metal layers. The embedded assembly 200 is shown to include a first metal layer 202, a second metal layer 204, a third metal layer 206, and a fourth metal layer 208. In an embodiment of the present invention, the metal layers are made of copper. The first metal layer 202, the second metal layer 204, the third metal layer 206, and the fourth metal layer 208 can be any of the plurality of metal layers. The metal layers can be present on either side of the organic substrate 102. In FIG. 2, the first metal layer 202, the second metal layer 204, and the third metal layer 206 are shown to be present on one side of the organic substrate 102 while the fourth metal layer 208 is shown be present on other side of the organic substrate 102. The first metal layer 202 is present over a surface of the organic substrate 102.

The embedded assembly 200 also includes an adhesion promoting treatment layer 210 and a dielectric layer 212. The adhesion promoting treatment layer 210 covers the first metal layer 202. The dielectric layer 212 is provided on the adhesion promoting treatment layer 210. The second metal layer 204 is laminated over the dielectric layer 212. In an embodiment of the present invention, any two adjacent metal layers of the plurality of metal layers are separated by a dielectric layer, using an adhesion promoting treatment layer. For example, the first metal layer 202 and the second metal layer 204 are separated by the dielectric layer 212. Examples of the material used for the dielectric layer 212 include a ceramic-filled photo-dielectric (CFP) material, and the like. The CFP has a dielectric constant of 20 and a loss tangent of 0.02, and can be formed into thin layers that are pinhole-free suitable for use as a capacitor. Examples of the material used for the adhesion promoting treatment layer 210 include black oxide, brown oxide, and the like.

The embedded assembly 200 further includes a resin layer 214. In an embodiment of the present invention, any two adjacent metal layers of the plurality of metal layers are separated by the resin layer 214. For example, the resin layer 214 is laminated over exposed surfaces of the first metal layer 202 and the second metal layer 204. In an embodiment of the present invention, the resin layer 214 is alternatively referred to as a High Density Interconnect (HDI) layer. Examples of the material used for the resin layer 214 include, but are not limited to, a higher Elastic Modulus adhesive film.

The movable element 104 can be present on any of the plurality of metal layers. In an embodiment, the movable element 104 is present on an etched portion of the third metal layer 206. Similarly, the movable element 104 may be present at any of the first metal layer 202, the second metal layer 204, and the fourth metal layer 208. In an embodiment, a movable element is fabricated from the same material and at the same time as one of the plurality of metal layers at which the movable element is present. For example, in reference to FIG. 2, the movable element 104 is fabricated from the same material and at the same time as the third metal layer 206.

The antenna element 106 is secured to corresponding antenna metallization patterns that are formed on the third metal layer 206. In an embodiment of the present invention, antenna metallization patterns can be formed on any of the plurality of metal layers. For example, the antenna metallization patterns can be formed on any of the first metal layer 202, the second metal layer 204, the third metal layer 206, and the fourth metal layer 208.

The embedded assembly 200 further includes a passive device 216, a microvia 218, and a plated through hole 220. The passive device 216 can be present on any of the plurality of metal layers. In an embodiment of the present invention, the passive device 216 is present on an etched portion of the first metal layer 202. Though the embedded assembly 200 is shown to include only one passive device that is the passive device 216, the embedded assembly 200 can include more than one passive device. Examples of the passive device 216 include, but are not limited to, a switch, a variable/tuner capacitor, a polymer thick film resistor, an inductor, and a MEMS resonator. The microvia 218 connects the first metal layer 202 and the third metal layer 206. In an embodiment of the present invention, one or more microvias and plated through holes connect the plurality of metal layers, the movable element 104, and the antenna element 106.

Figure 3:
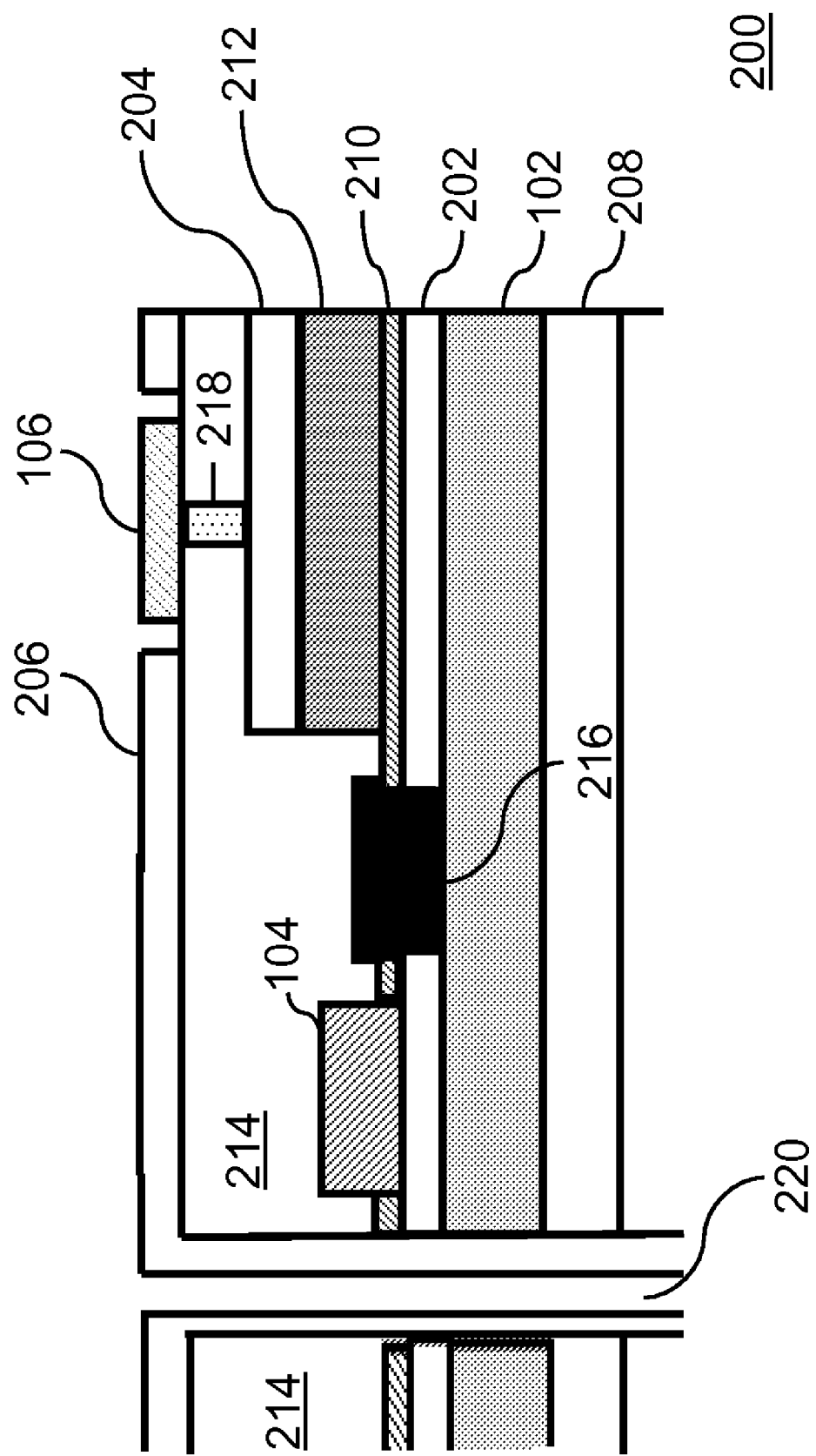
FIG. 3 is a block diagram illustrating cross-sectional view of components of the embedded assembly, in accordance with another embodiment of the present invention.

FIG. 3 is a block diagram illustrating a cross-sectional view of components of the embedded assembly 200, in accordance with another embodiment of the present invention. In the embedded assembly 200, the movable element 104 is present on an etched portion of the first metal layer 202 and covered with the resin layer 214. In various embodiments of the present invention, the movable element 104 can be present on any of the plurality of metal layers.

Figure 4:
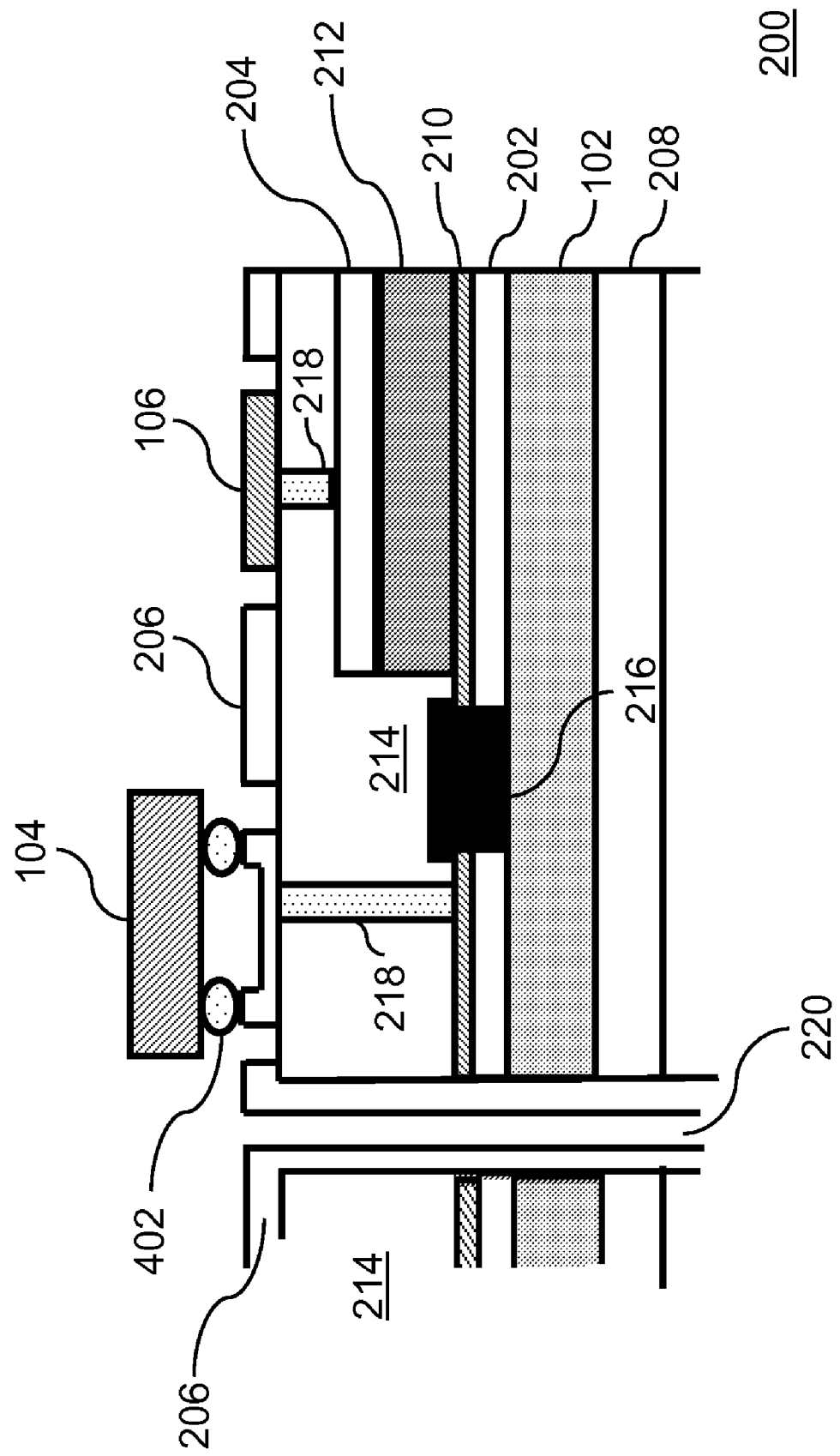
FIG. 4 is a block diagram illustrating cross-sectional view of components of the embedded assembly, in accordance with yet another embodiment of the present invention.

FIG. 4 is a block diagram illustrating a cross-sectional view of components of the embedded assembly 200, in accordance with yet another embodiment of the present invention. In this embodiment, the movable element 104 is secured to the third metal layer 206 as a separate package. The movable element 104 can be secured to the third metal layer 206 by using solder joints 402. In various embodiments of the present invention, the movable element 104 can be secured as a separate package to any of exposed metal layers from the plurality of metal layers.

Figure 5:
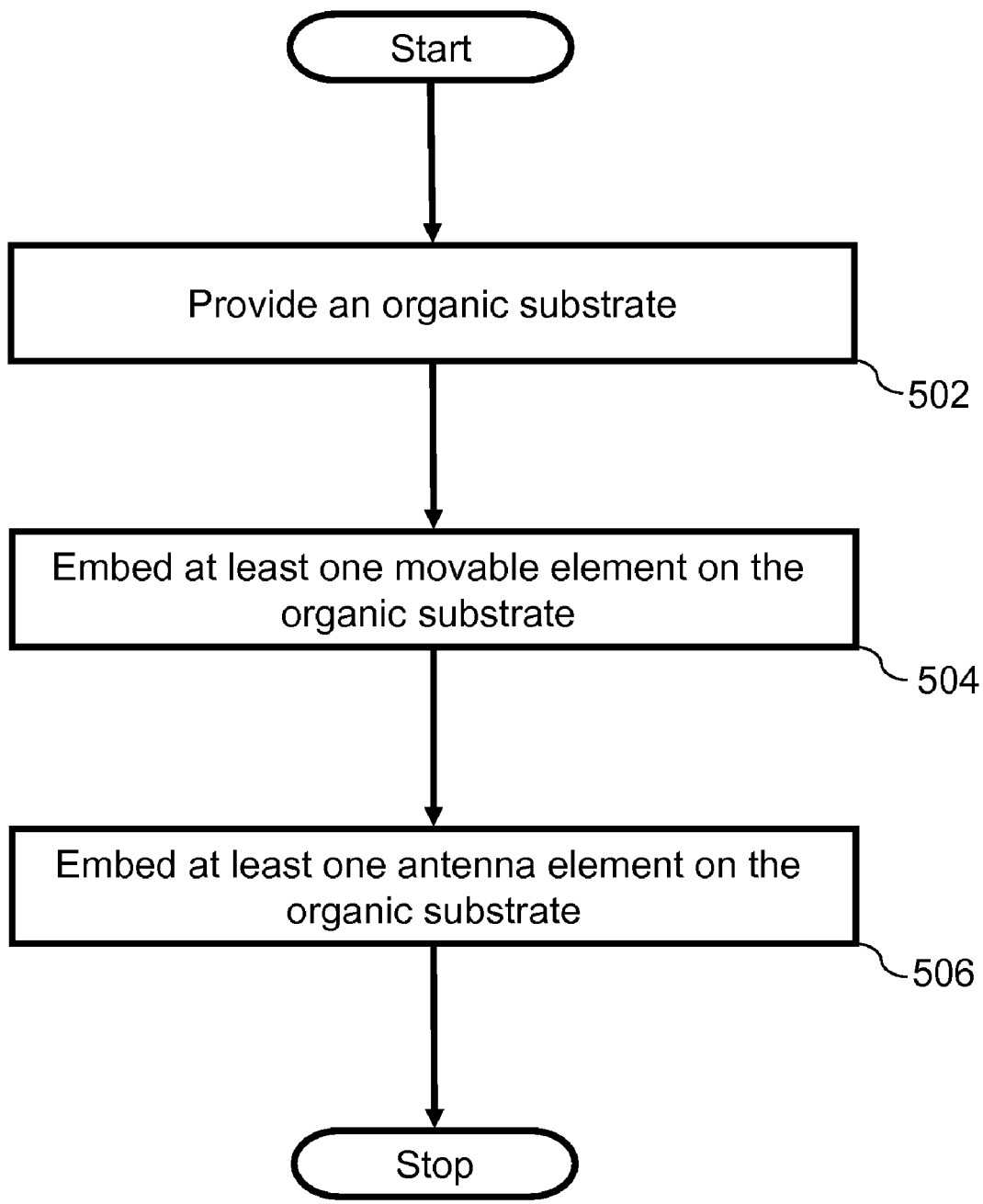
FIG. 5 illustrates a flowchart depicting a method for fabricating the embedded assembly, in accordance with an embodiment of the present invention.
Figure 6:
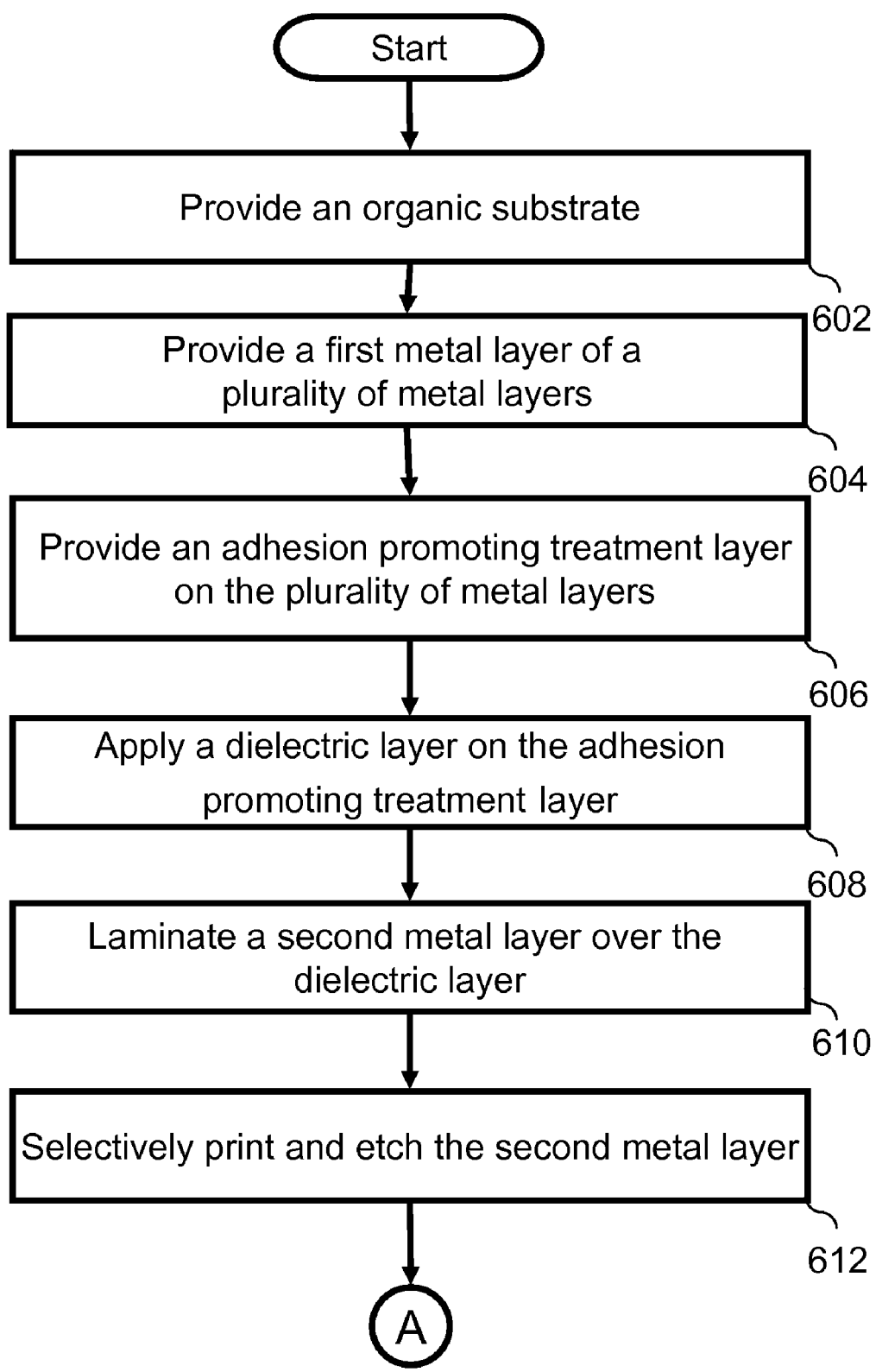
FIGS. 6, 7, 8, and 9 illustrate a flowchart depicting a method for fabricating the embedded assembly, in accordance with another embodiment of the present invention.
Figure 7:
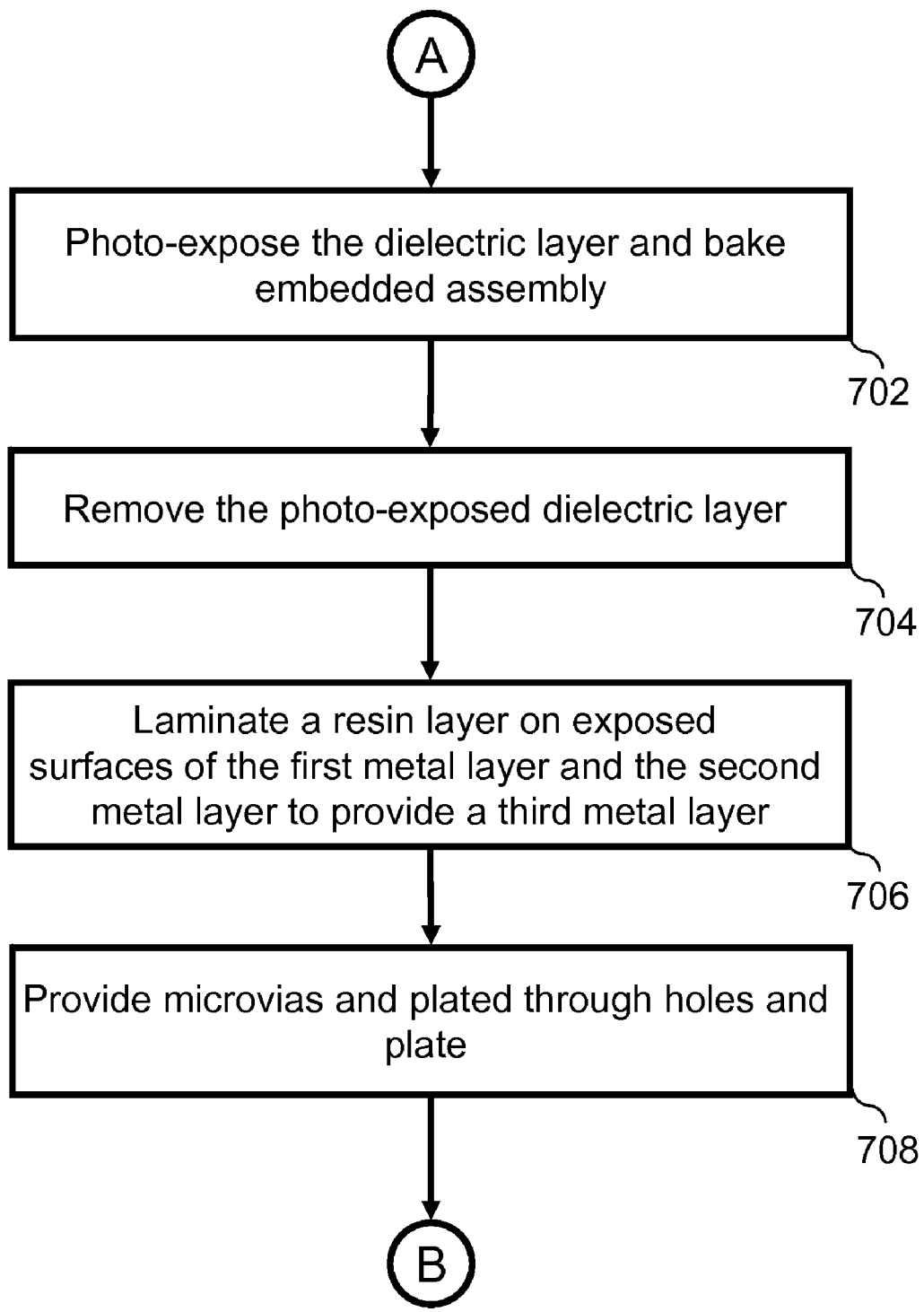
Figure 8:
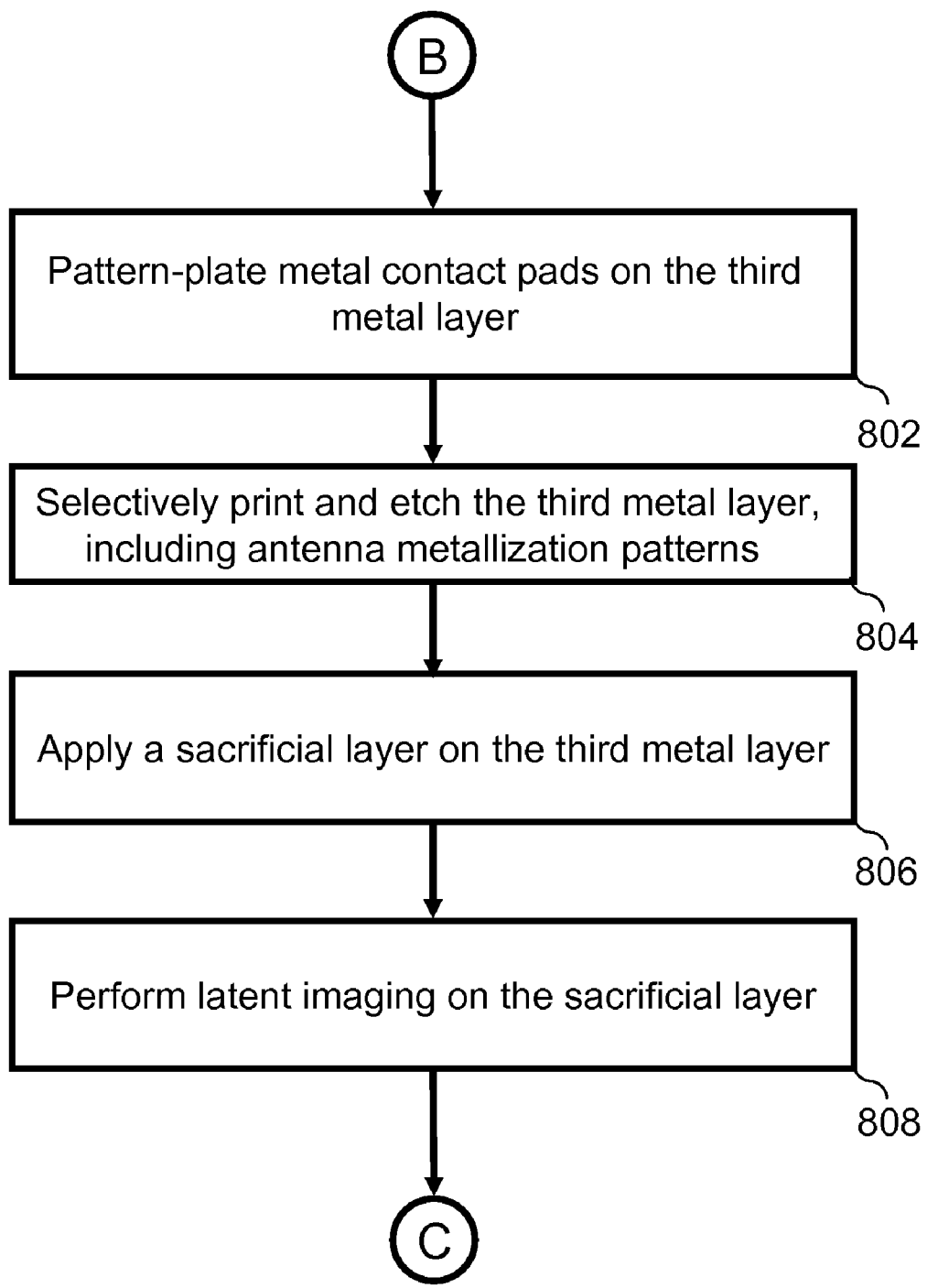
Figure 9:
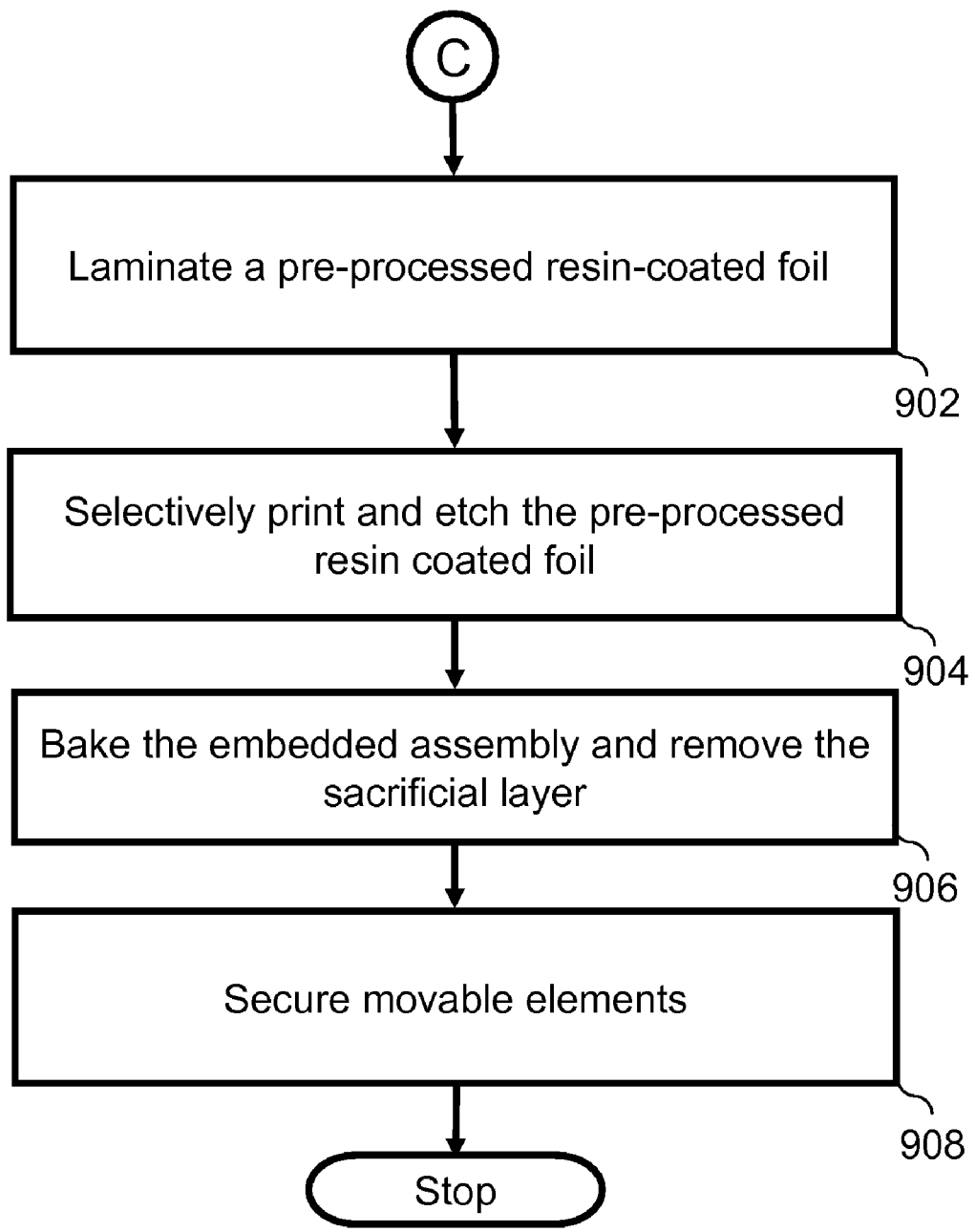

FIG. 5 illustrates a flowchart depicting a method for fabricating an embedded assembly, in accordance with an embodiment of the present invention. At step 502, an organic substrate is provided. At step 504, at least one movable element is embedded on the organic substrate. In an embodiment of the present invention, the at least one movable element may be secured as a separate package to an exposed metal layer from a plurality of metal layers that are present on the organic substrate. The movable element as the separate package may be secured by using solder joints. In another embodiment of the present invention, the movable element can be fabricated on an exposed metal from the plurality of metal layers present over the organic substrate. In yet another embodiment of the present invention, the at least one movable element may be embedded in between the plurality of metal layers and dielectric layers. In an embodiment of the present invention, the movable element is formed from the same material and at the same time as one of the plurality of metal layers on which the movable element is formed. At step 506, an antenna element is embedded on the organic substrate. The antenna element can be fabricated by etching one or more antenna metallization patterns that are formed on any of the plurality of metal layers present over the organic substrate. In an embodiment of the present invention, the antenna element is formed from the same material and at the same time as one of the plurality of metal layers on which the movable element is formed.

FIGS. 6, 7, 8, and 9 illustrate a flowchart depicting a method for fabricating an embedded assembly, in accordance with another embodiment of the present invention. To describe the method, reference will be made to FIGS. 2, 3 and 4, although it is understood that the method can be implemented with reference to any other suitable embodiment of the present invention. Further, the method can contain a greater or a fewer number of steps than shown in FIGS. 6, 7, 8, and 9.

At step 602, the organic substrate 102 is provided. At step 604, the first metal layer 202 of the plurality of metal layers is provided. A surface of the organic substrate 102 is covered with the first metal layer 202. At step 606, the adhesion promoting treatment layer 210 is applied on the plurality of the metal layers. At step 608, the dielectric layer 212 is applied on the adhesion promoting treatment layer 210. In an embodiment of the present invention, the dielectric layer 212 is coated on the adhesion promoting treatment layer 210. At step 610, the second metal layer 204 is laminated over the dielectric layer 212. At step 612, the second metal layer 204 is selectively printed and etched. In an embodiment of the present invention, the second metal layer 204 can be selectively printed and etched to expose a portion of the dielectric layer 212, forming a 'mezzanine' electrode. The mezzanine electrode, the first metal layer 202, and the adhesion promoting treatment layer 210, together form a structure to increase capacitance by making the dielectric layer 212 as thin as possible. The resin layer 214 is alternatively referred to a HDI layer.

At step 702, the dielectric layer 212 is photo-exposed and the embedded assembly 200 is baked. At step 704, selected portions of the photo-exposed dielectric layer 212 are removed. In an embodiment of the present invention, the selected portions can be unwanted portions of the photo-exposed dielectric layer 212. The photo-exposed dielectric layer 212 is removed by treating it with a solvent. The photo-exposed dielectric layer 212 is dissolved in the solvent to expose the first metal layer 202. Example of the solvent used includes Gamma-Butyro-Lactone (GBL), and the like. In an embodiment of the present invention, the first metal layer 202 can be selectively printed and etched. A stability promoter can be deposited on a selected etched portion of the first metal layer 202. In another embodiment of the present invention, a passive device 216 can be embedded on the selected etched portion of the first metal layer 202. Examples of the passive device 216 include, but are not limited to, a switch, a variable/tuner capacitor, a polymer thick film resistor, an inductor, and a MEMS resonator. In yet another embodiment of the present invention, the passive device 216 can be a polymer thick film resistor that can be screen printed on the adhesion promoting treatment layer 210. At step 706, the resin layer 214 is laminated on exposed surfaces of the first metal layer 202 and the second metal layer 204, to provide the third metal layer 206. At step 708, the microvia 218 and the plated through hole 220 are drilled and plated. In an embodiment of the present invention, the microvia 218 is drilled to connect the third metal layer 206 with any of the first metal layer 202 and the second metal layer 204. In another embodiment of the present invention, the microvia 218 is laser-formed to connect the third metal layer 206 with any of the first metal layer 202 and the second metal layer 204.

At step 802, one or more metal contact pads are pattern-plated on the third metal layer 206. In an embodiment of the present invention, the one or more metal contact pads can be pattern-plated on any of the plurality of metal layers. The one or more metal contact pads provide radio frequency (RF) signal path for the movable element 104. The one or more metal contact pads may also block radio frequency (RF) signal path to the movable element 104. At step 804, the third metal layer 206 is selective printed and etched. At step 806, a sacrificial layer is applied on a portion of the third metal layer 206 between the one or more contact pads. In an embodiment of the present invention, the sacrificial layer is applied to support the one or more metal contact pads. At step 808, latent imaging is performed on the sacrificial layer.

At step 902, a pre-processed resin-coated foil is laminated. At step 904, selective printing and etching are performed. In an embodiment of the present invention, the pre-processed resin-coated foil is selectively printed and etched. At step 906, the embedded assembly 200 is baked, the sacrificial layer is removed, and exposed surfaces of the embedded assembly 200 are cleaned. At step 908, the antenna element 106 is secured.

Various embodiments of the present invention, as described above, provide an embedded assembly and a method for fabricating the same. The embedded assembly facilitates the integration of a movable element and an antenna element in an organic substrate. The method enables the integration of key components, such as antennas, phase shifters, RF MEMS switches and devices, filters, and control circuitry of an electronic circuit by using PWB processes. The integration of components with a PWB minimizes RF interconnections that are external to PWB media.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method for fabricating an embedded assembly, the method comprising:

providing an organic substrate (102);

providing a first metal layer (206) existing on top of the organic substrate;

embedding at least one movable element (104) on the organic substrate, wherein the movable element is present on an etched portion of the first metal layer; and embedding at least one antenna element (106) on the organic substrate, wherein embedding the at least one movable element comprises:

providing a second metal layer (208) on the bottom of the substrate;

providing an adhesion promoting treatment layer on the first and the second metal layers;

applying a dielectric layer on the adhesion promoting treatment layer, wherein the dielectric layer is coated over the adhesion promoting treatment layer; and wherein the second metal layer is laminated over the dielectric layer, selectively printing and etching the second metal layer;

photo-exposing the dielectric layer and baking the embedded assembly;

removing the photo-exposed dielectric layer, wherein the photo-exposed dielectric layer is removed by treating the photo-exposed dielectric layer with a solvent to expose the first metal layer;

laminating a resin layer on exposed surfaces of the first metal layer and the second metal layer to provide a third metal layer, wherein the third metal layer is one of the plurality of metal layers; and providing and plating one or more microvias and plated through holes.

2. The method as recited in claim 1 further comprising:

pattern-plating one or more metal contact pads on the third metal layer; selectively printing and etching the third metal layer and one or more antenna metallization patterns;

surface finishing exposed surfaces of the one or more metal contact pads; and applying a sacrificial layer on the third metal layer.

3. The method as recited in claim 2 further comprising:

performing latent imaging on the sacrificial layer;

laminating a pre-processed resin-coated foil;

selectively printing and etching the pre-processed resin-coated foil; and baking the embedded assembly and remove the sacrificial layer.

4. The method as recited in claim 3, wherein the at least one movable element is embedded and connected to the at least one antenna element corresponding to the one or more antenna metallization patterns, further wherein the one or more antenna metallization patterns are formed on at least one of the plurality of metal layers.

5. The method as recited in claim 4, wherein the at least one movable element is secured as a separate package to an exposed metal layer of the plurality of metal layers.

6. The method as recited in claim 1 further comprising embedding at least one passive device on the organic substrate, wherein the at least one passive device is at least one of: a switch, a variable/tuner capacitor, a polymer thick film resistor, an inductor, and a MEMS resonator.

* * * * *